United States Patent
Lu et al.

(10) Patent No.: US 8,344,519 B2
(45) Date of Patent: *Jan. 1, 2013

(54) STACKED-DIE PACKAGE FOR BATTERY POWER MANAGEMENT

(75) Inventors: Jun Lu, San Jose, CA (US); Allen Chang, Fremont, CA (US); Xiaotian Zhang, San Jose, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/089,065

(22) Filed: Apr. 18, 2011

(65) Prior Publication Data

US 2011/0278709 A1 Nov. 17, 2011

Related U.S. Application Data

(63) Continuation of application No. 13/007,279, filed on Jan. 14, 2011, now Pat. No. 8,049,315, and a continuation of application No. 12/209,106, filed on Sep. 11, 2008, now Pat. No. 7,884,454, and a continuation of application No. 11/944,313, filed on Nov. 21, 2007, now Pat. No. 7,898,092, and a continuation-in-part of application No. 11/150,489, filed on Jun. 10, 2005, now Pat. No. 7,511,361, which is a continuation-in-part of application No. 11/029,653, filed on Jan. 5, 2005, now abandoned, application No. 13/089,065, which is a continuation-in-part of application No. 11/316,614, filed on Dec. 22, 2005, now Pat. No. 7,612,439.

(51) Int. Cl.
*H01L 23/48* (2006.01)

(52) U.S. Cl. ........ 257/777; 257/666; 257/686; 257/734; 257/E23.058; 257/E23.085; 257/E25.006; 257/E25.013; 257/E25.021; 257/E25.027

(58) Field of Classification Search .................. 257/686, 257/723, 777, E25.006
See application file for complete search history.

(56) References Cited

U.S. PATENT DOCUMENTS
5,495,398 A 2/1996 Takiar et al.
(Continued)

FOREIGN PATENT DOCUMENTS
KR 10-0826989 11/2004
(Continued)

OTHER PUBLICATIONS

Notice of Allowance and Fees Due dated Oct. 1, 2010 issued for U.S. Appl. No. 11/944,313.

(Continued)

*Primary Examiner* — Jasmine Clark
(74) *Attorney, Agent, or Firm* — Joshua D. Isenberg; JDI Patent

(57) ABSTRACT

A battery protection package assembly is disclosed. The assembly includes a power control integrated circuit (IC) with pins for a supply voltage input (VCC) and a ground (VSS) on a first side of the power control IC. First and second common-drain metal oxide semiconductor field effect transistors (MOSFETs) are electrically coupled to the power control IC. The power control IC and the first and second common-drain metal oxide semiconductor field effect transistors (MOSFET) are co-packaged on a common die pad. The power control IC is vertically stacked on top of one or more of the first and second common-drain MOSFETs. Leads coupled to a supply voltage input (VCC) and a ground (VSS) of the power control IC are on a first side of the common die pad.

5 Claims, 9 Drawing Sheets

U.S. PATENT DOCUMENTS

| | | | |
|---|---|---|---|
| 5,557,842 | A | 9/1996 | Bailey |
| 5,814,884 | A | 9/1998 | Davis et al. |
| 5,917,241 | A | 6/1999 | Nakayama et al. |
| 6,031,279 | A | 2/2000 | Lenz |
| 6,055,148 | A | 4/2000 | Grover |
| 6,184,585 | B1 | 2/2001 | Martinez et al. |
| 6,249,041 | B1 | 6/2001 | Kasem et al. |
| 6,265,763 | B1 | 7/2001 | Jao et al. |
| 6,414,387 | B1 | 7/2002 | Hara et al. |
| 6,424,035 | B1 | 7/2002 | Sapp et al. |
| 6,593,622 | B2 | 7/2003 | Kinzer et al. |
| 6,677,669 | B2 | 1/2004 | Standing |
| 6,777,800 | B2 | 8/2004 | Madrid et al. |
| 6,841,852 | B2 | 1/2005 | Luo et al. |
| 6,858,922 | B2 | 2/2005 | Pavier |
| 6,864,588 | B2 | 3/2005 | Hung |
| 6,933,593 | B2 | 8/2005 | Fissore et al. |
| 7,030,501 | B2 | 4/2006 | Yoshiba et al. |
| 7,057,273 | B2 | 6/2006 | Harnden et al. |
| 7,088,074 | B2 | 8/2006 | Clevenger et al. |
| 7,115,985 | B2 | 10/2006 | Antol et al. |
| 7,166,496 | B1 | 1/2007 | Lopez et al. |
| 7,166,919 | B2 | 1/2007 | Tabira |
| 7,183,616 | B2 | 2/2007 | Bhalla et al. |
| 7,215,012 | B2 | 5/2007 | Harnden et al. |
| 7,301,235 | B2 | 11/2007 | Schaffer et al. |
| 7,508,012 | B2 | 3/2009 | Otremba |
| 7,511,361 | B2 | 3/2009 | Zhang et al. |
| 7,514,778 | B2 | 4/2009 | Otremba et al. |
| 7,612,439 | B2 | 11/2009 | Zhang et al. |
| 7,884,454 | B2 | 2/2011 | Lu et al. |
| 7,898,092 | B2 * | 3/2011 | Lu et al. ............ 257/777 |
| 2001/0019490 | A1 | 9/2001 | Igarashi et al. |
| 2002/0093094 | A1 | 7/2002 | Takagawa et al. |
| 2002/0163040 | A1 | 11/2002 | Kinzer et al. |
| 2004/0004272 | A1 | 1/2004 | Luo et al. |
| 2004/0227547 | A1 | 11/2004 | Shiraishi et al. |
| 2004/0251529 | A1 | 12/2004 | Lee et al. |
| 2005/0017339 | A1 | 1/2005 | Yoshiba et al. |
| 2005/0082679 | A1 | 4/2005 | Otremba |
| 2005/0133902 | A1 | 6/2005 | Pavier et al. |
| 2005/0145996 | A1 | 7/2005 | Luo et al. |
| 2005/0145998 | A1 | 7/2005 | Harnden et al. |
| 2006/0118815 | A1 | 6/2006 | Otremba et al. |
| 2006/0145312 | A1 | 7/2006 | Liu |
| 2006/0145318 | A1 | 7/2006 | Zhang et al. |
| 2007/0007640 | A1 | 1/2007 | Harnden et al. |
| 2007/0080443 | A1 | 4/2007 | Sun et al. |
| 2007/0085187 | A1 | 4/2007 | Sun et al. |
| 2007/0145609 | A1 | 6/2007 | Zhang et al. |
| 2007/0215996 | A1 | 9/2007 | Otremba |
| 2008/0111219 | A1 | 5/2008 | Harnden et al. |
| 2008/0207094 | A1 | 8/2008 | Feng et al. |
| 2008/0224323 | A1 | 9/2008 | Otremba |
| 2008/0242052 | A1 | 10/2008 | Feng et al. |
| 2008/0296782 | A1 | 12/2008 | Otremba et al. |
| 2009/0008758 | A1 | 1/2009 | Lu et al. |
| 2009/0020854 | A1 | 1/2009 | Feng et al. |
| 2009/0128968 | A1 | 5/2009 | Lu et al. |
| 2009/0179265 | A1 | 7/2009 | Harnden et al. |
| 2009/0189281 | A1 | 7/2009 | Han |
| 2009/0258458 | A1 | 10/2009 | Zhang et al. |

FOREIGN PATENT DOCUMENTS

| | | | |
|---|---|---|---|
| KR | 10-2004-92304 | | 5/2008 |
| TW | 375330 | | 11/1999 |

OTHER PUBLICATIONS

Notice of Rejection dated Nov. 16, 2010 issued for Korean patent application No. 10-2009-0019811.
International Search Report and Written Opinion of the International Searching Authority dated Apr. 6, 2009 for the International Patent Application No. PCT/US2008/074924, 11 pages.
Office Action dated Nov. 24, 2009 for U.S. Appl. No. 11/944,313.
Ex Parter Quayle Action dated Nov. 25, 2008 for U.S. Appl. No. 11/316,614.
Notice of Allowance and Fee(s) Due dated Jun. 25, 2009 for U.S. Appl. No. 11/316,614.
Office Action dated May 16, 2007 for U.S. Appl. No. 11/150,489.
Notice of Allowance and Fee(s) Due dated Nov. 17, 2008 for U.S. Appl. No. 11/150,489.
Final Office Action dated Feb. 25, 2008 for U.S. Appl. No. 11/150,489.
Final Office Action dated Feb. 23, 2010 for U.S. Appl. No. 11/029,653.
International Search Report and Written Opinion of International Application No. PCT/US06/00356, mailing date Jul. 19, 2006.
Notification concerning availability of the publication of the International Application of PCT/US06/00356, mailing date Nov. 9, 2006.
Notification concerning transmittal of international preliminary report for PCT/US06/00356, mailing date Jul. 19, 2007.
International Search Report and Written Opinion of International Application No. PCT/US2006/022909 mailing date Feb. 28, 2008.
Notification Concerning Transmittal of international Preliminary Report on Patentability for PCT/US2006/022909, Mailing date Mar. 19, 2009.
Office Action dated Aug. 18, 2009 for U.S. Appl. No. 11/029,653.
U.S. Appl. No. 12/384,100, filed Mar. 30, 2009, entitled DFN Semiconductor Package Having Reduced Electrical Resistance and identifying Xiaotian Zhang et al. as inventors.
English translation of Taiwanese model No. 375330 published Nov. 21, 1999.
Notice of Allowance and Fee(s) Due dated Sep. 17, 2008 for U.S. Appl. No. 11/029,653.
Office Action dated Mar. 20, 2008 for U.S. Appl. No. 11/029,653.
General definition of Dual Flat No lead by www.answers.com search word: Dual flat no lead.
Advisory Action dated Nov. 27, 2007 for U.S. Appl. No. 11/029,653.
Final Office Action dated Aug. 6, 2007 for U.S. Appl. No. 11/029,653.
Office Action dated Nov. 28, 2006 for U.S. Appl. No. 11/029,653.
Office Action dated Feb. 22, 2006 issued for U.S. Appl. No. 11/029,653.
Office Action dated Apr. 14, 2010 issued for U.S. Appl. No. 11/944,313.
Advisory Action dated Jul. 28, 2008 issued for U.S. Appl. No. 11/150,489.
Notice of Allowance and Fees Due dated Jun. 23, 2008 issued for U.S. Appl. No. 11/316,614.
Office Action dated Feb. 6, 2008 issued for U.S. Appl. No. 11/316,614.
Bonnie C. Baker, "Smaller Packages=Bigger Thermal Challenges", 2003 Microchip Technology, Inc.
Office Action dated Apr. 14, 2010 issued for U.S. Appl. No. 12/209,106.
Notice of Allowance and Fee(s) Due dated Sep. 30, 2010 issued for U.S. Appl. No. 12/209,106.

* cited by examiner

SECTION D-D

SECTION E-E

STACKED-DIE PACKAGE FOR BATTERY POWER MANAGEMENT

CROSS REFERENCE TO RELATED APPLICATION AND CLAIM OF PRIORITY

This application is a continuation of U.S. application Ser. No. 13/007,279 filed Jan. 14, 2011 now U.S. Pat. No. 8,049,315, the entire disclosures of which are incorporated herein by reference. Application Ser. No. 13/007,279 claims the priority benefit of U.S. application Ser. No. 11/944,313 and U.S. application Ser. No. 12/209,106.

This application is a continuation application of U.S. application Ser. No. 12/209,106 filed Sep. 11, 2008, now U.S. Pat. No. 7,884,454, the entire disclosures of which are incorporated herein by reference.

This application is also a continuation of U.S. application Ser. No. 11/944,313 filed Nov. 21, 2007, now U.S. Pat. No. 7,898,092, the entire disclosures of which are incorporated herein by reference.

U.S. application Ser. No. 12/209,106 claims priority to U.S. application Ser. No. 11/150,489, U.S. application Ser. No. 11/029,653, and U.S. application Ser. No. 11/316,614. This application is a continuation in part (CIP) application of U.S. application Ser. No. 11/150,489 filed Jun. 10, 2005 and issued as U.S. Pat. No. 7,511,361, which is a CIP of U.S. application Ser. No. 11/029,653 filed Jan. 5, 2005 now abandoned and published as US Patent Application Publication number 20060145312 the entire disclosures of all of which are incorporated herein by reference. This application is a continuation in part (CIP) application of U.S. application Ser. No. 11/316,614 filed Dec. 22, 2005 and issued as U.S. Pat. No. 7,612,439, the entire disclosures of which are incorporated herein by reference.

FIELD OF THE INVENTION

This invention generally relates to battery protection devices and more particularly to a stacked-die package for battery power management.

BACKGROUND OF THE INVENTION

A typical battery pack used in portable electronic apparatuses includes a plurality of bare cells, a protective circuit module (PCM) in which a protective circuit for controlling the charge and discharge of the bare cells is formed, and a terminal line for electrically connecting the bare cells and the protective circuit to each other. The bare cells, the PCM, and the terminal line can be accommodated in a predetermined case.

The charge management system and battery protection IC offer extensive battery over-voltage and over-current protection, battery pre-conditioning and one percent charger voltage accuracy. They are paced in a small thermally enhanced lead frame package which may be a small surface mount device (SMD).

Conventional technologies to further reduce the size of battery protection integrated circuit (IC) are challenged by several technical difficulties and limitations. Conventional battery protection IC typically includes a power control IC and integrated dual common-drain metal oxide semiconductor field effect transistors (MOSFETs), which are packed in a lead frame package with a small foot print of a size as small as 2×5 mm. FIG. 1 is a circuit diagram illustrating a battery protection IC package of the prior art and FIG. 2 is a top view of a battery package assembly of FIG. 1.

As shown in FIG. 1, a protective circuit module 100 may include a power control IC 102 and dual common-drain MOSFETs 106 and 108 that are co-packed in a module package. In FIG. 1 VCC indicates an input supply pin that may be connected to the anode of a battery, e.g., a lithium-ion or lithium polymer battery cell, via a resistor. VSS indicates a ground pin that may be connected to a source S1 of an internal discharge MOSFET 106 and the cathode of the battery. VM indicates an over-charge and charger voltage monitor pin. OUTM indicates an output pin that may be connected to a source S2 of an internal charge MOSFET 108. DO and CO indicate pins of the power control IC 102 that may be connected the gate of the discharge MOSFET 106 and gate of charge MOSFET 108 respectively. MOSFETs 106 and 108 may be dual common-drain MOSFETs that are fabricated on single semiconductor chip with the same drain pad for drains D1 and D2 but distinct source and gate pads. A current-limiting resister R1 forms a low pass filter with a capacitor C1 to reduce supply voltage fluctuation. A resistor R2 provides ESD protection and current-limiting capability in the event of reverse charging. Capacitor C1 and both resistors R1 and R2 may be located outside the package 100. Pins VM and VCC of the control IC 102 may be electrically connected to the VM and VCC pins of the circuit module 100. The source voltage input VSS of the control IC 102 may be connected to the VSS pin of the circuit module 100.

The power control IC 102 may be positioned on a lead frame die pad 112 and integrated dual common-drain MOSFETs 106 and 108 may be positioned on another die pad 104. Two die pads 104 and 112 may be included in a lead frame package. Connections between the electrodes and leads in the circuit shown in FIG. 1 may be furnished by bond wires. To minimize the parasitic effect of bond wires the VSS lead and VCC lead of the lead frame package may be located on opposite sites of the package, which is not a preferred pin layout when the package is attached onto a printed circuit board. In this prior art package, because the power control IC 102 and dual common-drain MOSFETs 106 and 108 are attached onto two separate die pads, and because the control IC 102 requires a finite size of die pad 112 for attaching the IC, the available size for die pad 104 to accommodate the dual common-drain MOSFETs 106 and 108 of possibly maximum size is further limited for a lead frame package of a given footprint size, which may further result in increase in turn-on resistance of the dual common-drain MOSFETs. The size of the lead frame package is typically about 2 mm×5 mm.

Best performance for the battery protection package is conventionally achieved by using the largest possible MOSFET die size to minimize the drain to source turn-on resistance ($R_{ds-on}$). However, the power control IC 102 also takes up space on the lead frame, which limits the space available for the MOSFETs 106 and 108. Only relatively small MOSFETs, typically having a maximum drain to source resistance of about 48-60 mΩ including the resistance of bond wires to the MOSFETs, tend to fit in a 2×5 mm lead frame package. This reduces the efficiency of a power management package in this size range. If a lower turn-on resistance is desired, a package with preferably larger footprint is needed to meet the requirement.

It is within this context that embodiments of the present invention arise. It would be desirable to develop a package which would use the same or smaller package for integrated dual common-drain MOSFETs with lager size and smaller $R_{ds-on}$. It would be further desirable to produce such a package with a thinner package thickness. It would also be desirable to bring the VSS and VCC pins of the package on the same side of the package which is preferable for application usage.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
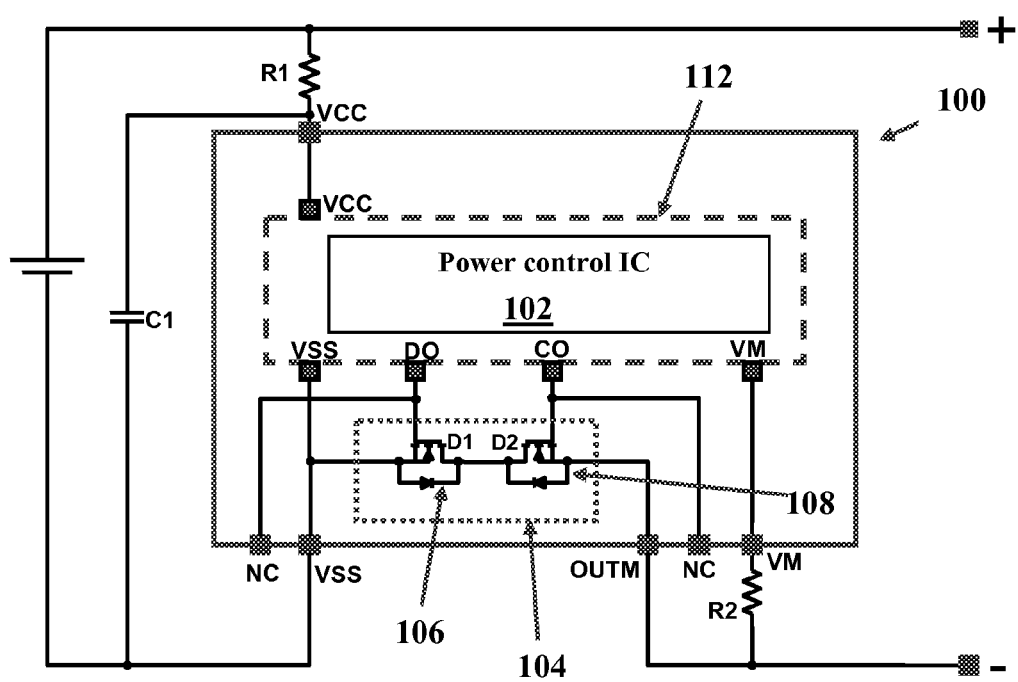
FIG. 1 is a circuit schematic of a battery protection package of the prior art.
Figure 2A:
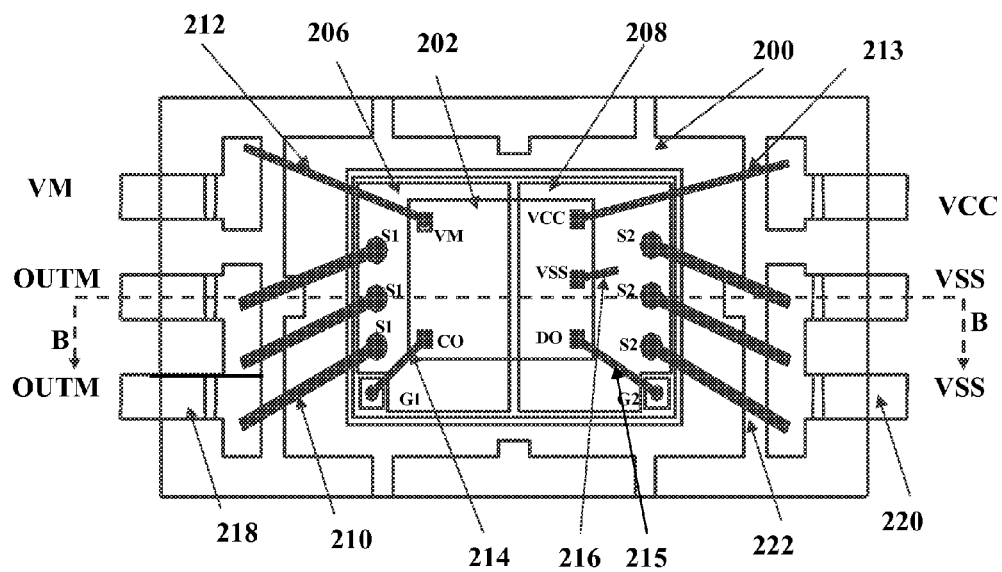
FIG. 2A is a top view of a battery protection package assembly having integrated dual common-drain MOSFETs of equal size with VCC and VSS located on a right side of the battery protection package.

Embodiments of the present invention provide a battery protection package with better performance, smaller form factor and a superior pin-out arrangement. In embodiments of the present invention, a power control IC may be stacked on top of integrated dual common-drain MOSFETs or overlapping two discrete MOSFETs and single die pad may be utilized for attaching the MOSFETs of all configurations. FIG. 2A is a top view of a battery protection package assembly including integrated dual common-drain MOSFETs in which two MOSFETs of the equal size sharing a common drain pad on bottom are proximate to each other according to an embodiment of the present invention. As shown in FIG. 2A, dual common-drain MOSFETs 206 and 208, fabricated with single piece of semiconductor chip, may be of the same source and gate size and attached onto a die pad 200. The source and gate layout of the dual MOSFETs may be symmetric along the centerline of the MOSFETs. A power control IC 202 is stacked on top of the dual MOSFETs 206 and 208 and overlaps both portions of the source areas of MOSFETs 206 and 208 but not the gate areas. In this embodiment, the VCC and VSS leads are on a right side of the battery protection package. Input pads for the voltage monitor VM and supply voltage VCC of the power control IC 202 may be electrically connected to the VM and VCC leads of the package through bond wires 212 and 213 respectively. Output CO and DO pads of the power control IC 202 are electrically connected to gate pads G1 and G2 of MOSFETs 206 and 208 through bond wires 214 and 215 respectively. The VSS pad of power control IC 202 is electrically connected to the top source pad S2 of the MOSFET 208 through a bond wire 216. Source pads 51 of the MOSFET 206 and top source pads S2 of the MOSFET 208 may be electrically connected to fused OUTM leads 218 and fused VSS lead 220 through multiple bond wires 210 and 222 respectively. Additionally, the distance between bonding wires 210 and the distance between the bonding wires 222 are not compromised thereby providing lower electrical resistance. The bond wires may be made of a suitable metal including, but not limited to, gold (Au), copper (Cu) or aluminum (Al). Alternatively, the source pads 51 and S2 of dual MOSFETs 206 and 208 may be electrically connected to the fused OUTM leads 218 and fused VSS leads 220 through aluminum ribbons 211 and 209 respectively as shown in FIG. 2C. Pad locations on power control IC 202 and dual MOSFETs 206 and 208 may be different than that shown in FIGS. 2A-2C.

By way of example, the integrated dual common-drain MOSFETs 206 and 208 may be model AOSN651, DN652S or DN653S by Alpha and Omega Semiconductor of Sunnyvale, Calif. The control IC 202 may be a model S-8211CAA-WAP3 or 8211BAB-WAP3 battery protection IC from Seiko Instruments Inc of Chiba, Japan, or a model R5407W124CC-S2 from Ricoh Co. Ltd of Osaka, Japan.

An undesirable effect of stacking two dies over each other is an increase of package thickness which could limit the scope of application or even render the resulting device useless. To reduce the overall thickness of the package, thinner dies less than standard 8 mils may be used. Preferably the die thickness for both IC 202 and the dual common-drain MOSFETs die 207 is less than 6 mils. The reduced thickness of MOSFET die 207 further reduce the turn-on resistances of the dual common-drain MOSFETs 206 and 208. To fully utilize the benefit of thin dies, ultra thin dies with a thickness as small as 2 mils may be employed for both IC 202 and MOSFET die 207. Examples of technologies to produce such ultra thin die are disclosed in U.S. patent application Ser. Nos. 11/712,846 filed on Feb. 28, 2007; 11/694,888 filed on Mar. 30, 2007 and 11/880,455 filed on Jul. 20, 2007 all of which are currently assigned to the same assignee and all of which are incorporated herein by reference.

Figure 2B:
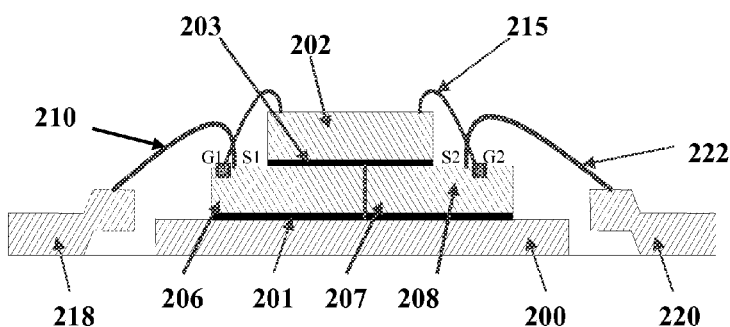
FIG. 2B is a cross-sectional view along a section B-B of the battery protection package of FIG. 2A.
Figure 2C:
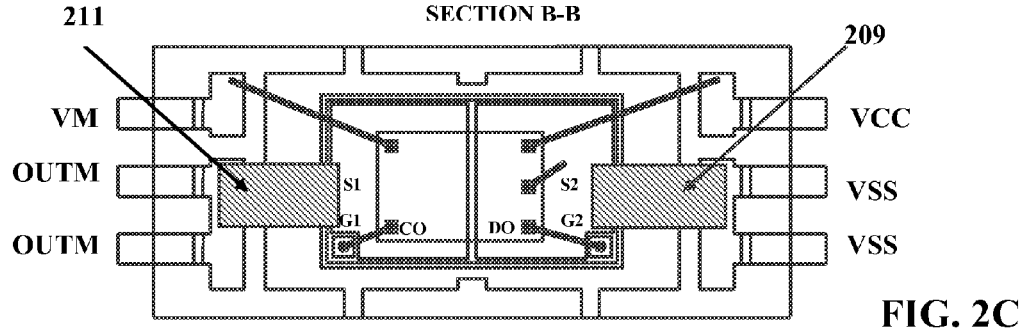
FIG. 2C is a top view of an alternative battery protection package assembly.

FIG. 2B is a cross-sectional view of the battery protection package of FIG. 2A along section B-B. As shown in FIG. 2B, power control IC 202 is stacked on top of dual MOSFETs 206 and 208 such that the power control IC 202 overlaps of both portions of the source areas of dual MOSFETs 206 and 208. The gate metal pads and source metal pads of 3-5 micron thick aluminum, of the dual common-drain MOSFETs 206 and 208 may be located on a portion of the top surface of the MOSFETs 206 and 208. The drain metal pads of about 1 to 3 micron thick TiNiAg, of the dual common-drain MOSFETs 206 and 208 are located on the whole bottom surface of the MOSFETs 206 and 208. An insulating adhesive layer 203, such as an electrically non-conductive epoxy layer is formed between the power control IC 202 and dual common-drain MOSFETs 206 and 208. The insulating adhesive layer 203 not only provides mechanical bonding between the IC and MOSFETs, but also serves as electrical insulating barriers because there exists an electrical potential difference between the IC 202 and MOSFETs 206 and 208 that will cause device malfunction if not insulated properly. Traditional epoxy dispensing and die attaching in IC packaging may not provide adequate insulation between sources of MOSFETs 206 and 208 and IC 202. To ensure proper insulation, special steps may be followed to form a high quality insulation layer 203. In one embodiment, a non-conductive epoxy such as Ablesbond 8006NS or Ablecoat 8008NC from Abelstik Laboratories of Rancho Dominguez, Calif., is coated on the backside of the IC wafer, the epoxy coated on the backside of IC wafer is then half cured in an oven. The IC with half cured back coated epoxy is diced and attached onto the MOSFET at elevated temperature and then fully cured. In another embodiment, a second non-conductive epoxy is applied to the top surface of MOSFET before the IC die coated with a first layer of epoxy attached thereon. In another embodiment the dual common-drain MOSFET die further include a passivation layer formed atop the source for further insulation.

The integrated dual common-drain MOSFETs 206 and 208 are attached and the common drain pad of the MOSFETs 206 and 208 is electrically connected to the lead frame die pad 200 through an electrically conductive bonding agent 201, which can be soft solder, electrically conductive epoxy and other electrically conductive adhesive. As additional means of isolation protection, a portion of the source areas of the integrated common-drain MOSFETs that is right underneath of the power control IC 202 but slightly larger than the footprint of the IC 202 may be coated with an additional passivation layer (not shown), e.g., of silicon nitride, such that the portion of the source areas of the MOSFETs 206 and 208 that interfaces with IC 202 is completely covered by the passivation layer.

Figure 2D:
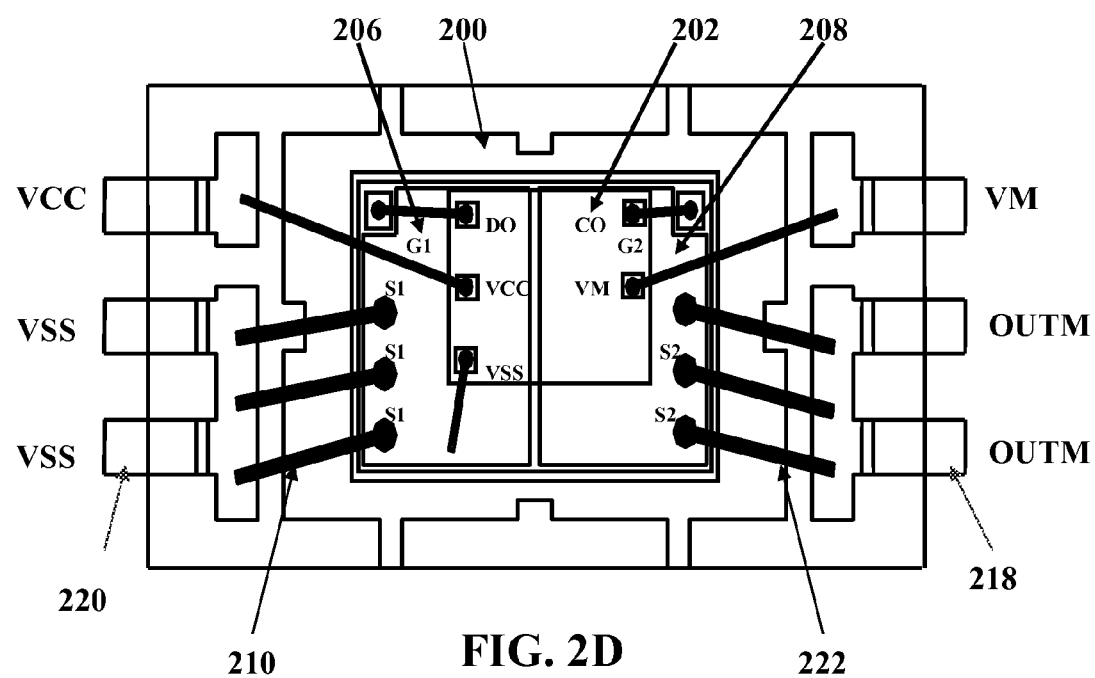
FIG. 2D is a top view of a battery protection package assembly having integrated dual common-drain MOSFETs of equal size with VCC and VSS located on a left side of the battery protection package.
Figure 2E:
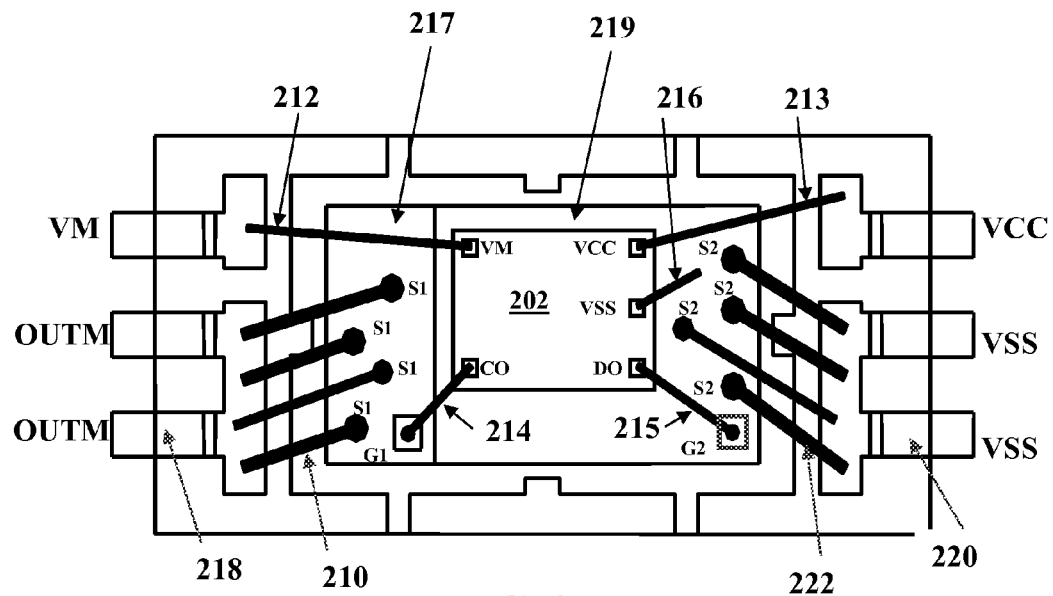
FIGS. 2E-2F are top views of battery protection package assemblies having integrated dual common-drain MOSFETs of unequal size with VCC and VSS located on a right side of the battery protection package.
Figure 2F:
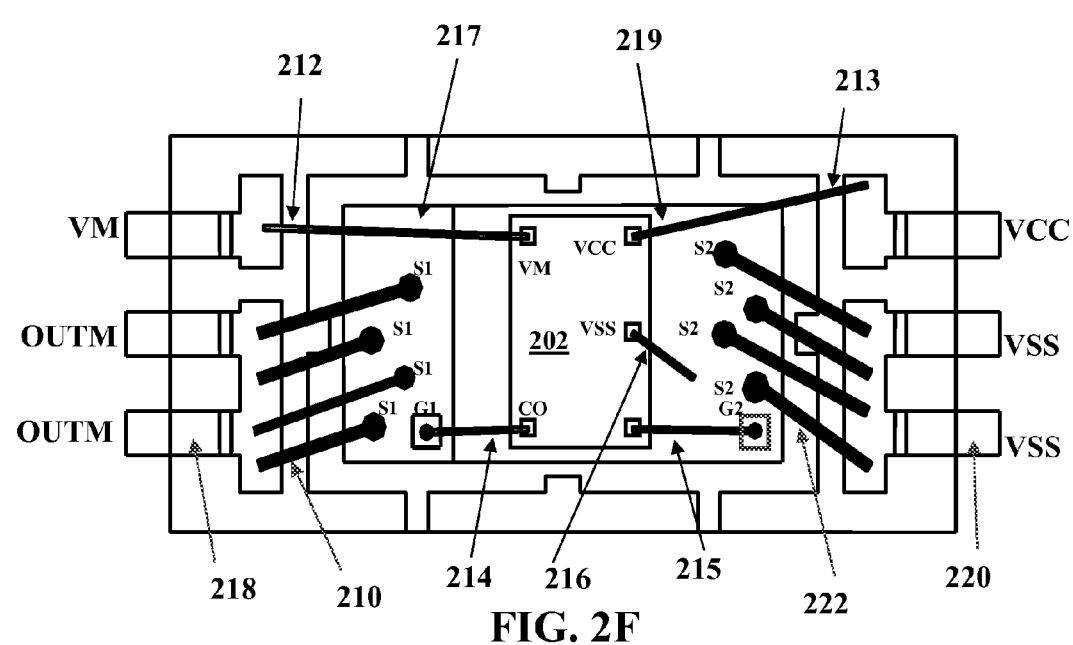

FIG. 2D is a top view of an alternative battery protection package assembly according to an embodiment of the present invention. The battery protection package of FIG. 2D is basically similar to the one of FIG. 2A, except that the VCC and VSS leads are on the left side of the battery protection package. In this embodiment, the source pad S1 of the MOSFET 206 are electrically connected to VSS lead 220 and the source pad S2 of the MOSFET 208 are connected to OUTM lead 218. FIGS. 2E-2F are top views of alternative battery protection package assemblies with integrated dual common-drain MOSFETs 217 and 219 having unequal sizes on single semiconductor chip. In this example, a first MOSFET 217 is smaller than a second MOSFET 219. In FIGS. 2E-2F, the VCC and VSS leads are on the right side of the battery protection package. In FIG. 2E, a power control IC 202 is stacked only on the second MOSFET 219 in such a way that a long side of the power control IC 202 is parallel to a long side of the second MOSFET 219. In FIG. 2F, the power control IC 202 is stacked only on the second MOSFET 219 in such a way that a long side of the power control IC 202 is perpendicular to a long side of the second MOSFET 219. VM and VCC pads of the power control IC 202 are electrically connected to the VM and VCC leads through bond wires 212 and 213 respectively. Output CO and DO pads of the power control IC 202 are electrically connected to gate pads G1 and G2 of MOSFETs 217 and 219 through bond wires 214 and 215 respectively. The VSS pad of power control IC 202 is electrically connected to the top source pad S2 of the second MOSFET 219 through a bond wire 216. Source pads S1 of the first MOSFET 217 and top source pads S2 of the second MOSFET 219 are electrically connected to the OUTM leads 218 and VSS lead 220 through bond wires 210 and 222 respectively.

Figure 2G:
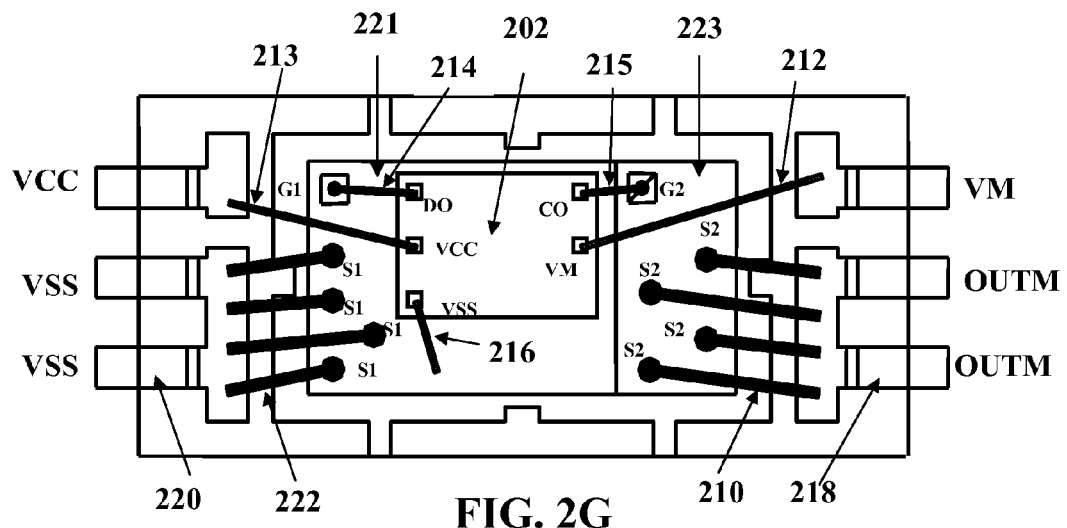
FIGS. 2G-2H are top views of battery protection package assemblies having integrated dual common-drain MOSFETs of unequal size with VCC and VSS located on a left side of the battery protection package.
Figure 2H:
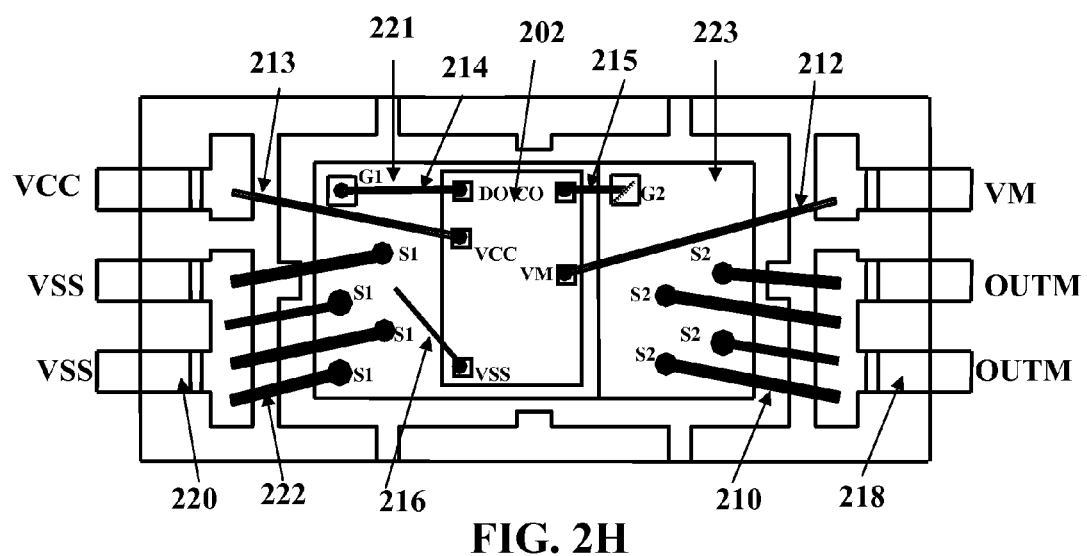

FIGS. 2G-2H are top views of other alternative battery protection package assemblies having integrated dual common-drain MOSFETs of unequal size. In these embodiments, the VCC and VSS leads are placed on the left side of the battery protection package. A first MOSFET 221 is bigger than a second MOSFET 223. In FIG. 2G, a power control IC 202 is stacked only on the first MOSFET 221 in such a way that a long side of the power control IC 202 is parallel to a long side of the first MOSFET 221. In FIG. 2H, the power control IC 202 is stacked only on the first MOSFET 221 in such a way that a long side of the power control IC 202 is perpendicular to a long side of the first MOSFET 221. VM and VCC pads of the power control IC 202 are electrically connected to the VM and VCC leads through bond wires 212 and 213 respectively. Output DO and CO pads of the power control IC 202 are electrically connected to gate pads G1 and G2 of the MOSFETs 221 and 223 through bond wires 214 and 215 respectively. The VSS pad of power control IC 202 is electrically connected to the top source pad 51 of the first MOSFET 221 through a bond wire 216. Source pads 51 of the first MOSFET 221 and top source pads S2 of the MOSFET 223 may be electrically connected to the VSS leads 220 and OUTM leads 218 through bond wires 222 and 210 respectively.

Figure 3A:
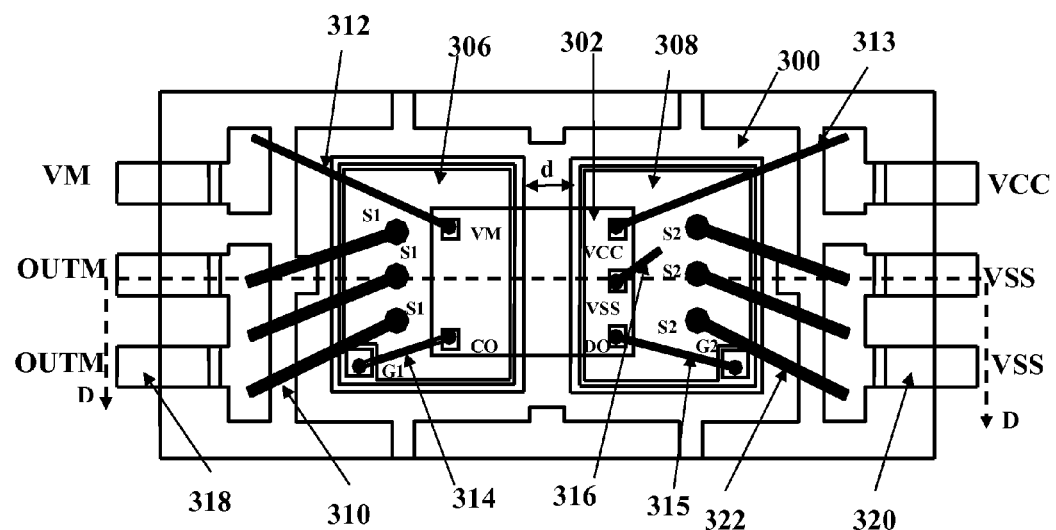
FIG. 3A is a top view of a battery protection package assembly having two discrete common-drain MOSFETs of equal size with VCC and VSS located on a right side of the battery protection package.

FIG. 3A is a top view of a battery protection package assembly including two equal size discrete MOSFETs separated to each other according to an embodiment of the present invention. As shown in FIG. 3A, two discrete MOSFETs 306 and 308 are of the same size and placed side by side, with a gap d in between them, on a lead frame die pad 300. A power control IC 302 is stacked on top of and overlaps both MOSFETs 306 and 308. In this embodiment, the VCC and VSS leads are on the right side of the battery protection package. VM and VCC pads of the power control IC 302 are electrically connected to the VM and VCC leads through bond wires 312 and 313 respectively. Output CO and DO pads of the power control IC 302 are electrically connected to gate pads G1 and G2 of MOSFETs 306 and 308 through bond wires 314 and 315 respectively. The VSS pad of power control IC 302 is electrically connected to the top source pad S2 of the MOSFET 308 through a bond wire 316. Source pads 51 of the MOSFET 306 and top source pads S2 of the MOSFET 308 are electrically connected to the OUTM leads 318 and VSS lead 320 through bond wires 310 and 322 respectively.

Figure 3B:
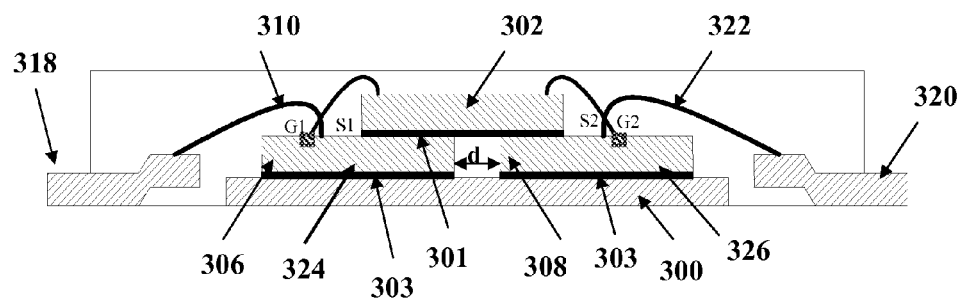
FIG. 3B is a cross-sectional view along a section D-D of the battery protection package of FIG. 3A.

FIG. 3B is a cross-sectional view of the battery protection package of FIG. 3A along section D-D. As shown in FIG. 3B, the discrete MOSFETs 306 and 308 may be placed side by side with a gap d in between them. In this embodiment, the power control IC 302 is stacked and overlaps on top of both MOSFETs 306 and 308 through an insulating adhesive layer 301. The drains 324 and 326 of the two MOSFETs 306 and 308 are attached and electrically connected to the lead frame die pad 300 through an electrically conductive adhesive or solder layer 303.

Figure 3C:
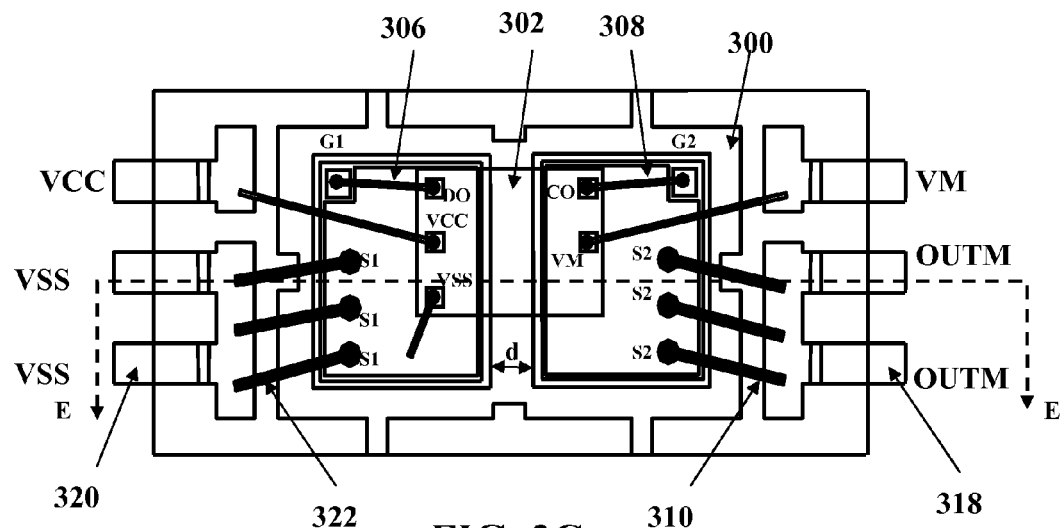
FIG. 3C is a top view of a battery protection package assembly having two discrete common-drain MOSFETs of equal size with VCC and VSS located on a left side of the battery protection package.
Figure 3D:
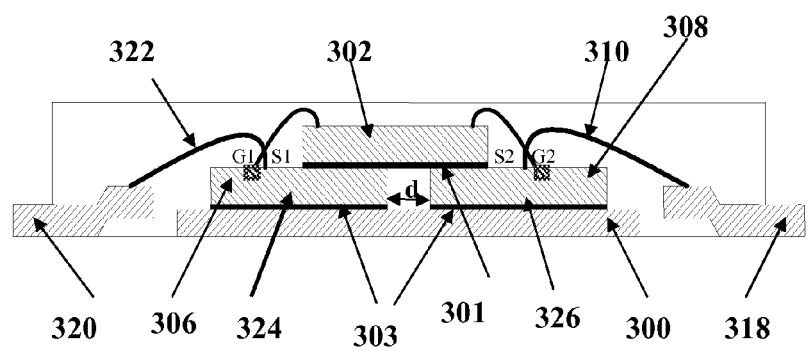
FIG. 3D is a cross-sectional view along a section E-E of the battery protection package of FIG. 3C.

FIG. 3C is a top view of an alternative battery protection package assembly according to an embodiment of the present invention. A side cross-sectional view of the battery package assembly along section E-E according to this embodiment is shown in FIG. 3D. The battery protection package of FIGS. 3C-3D is basically similar to the one of FIGS. 3A-3B, except the VCC and VSS leads are on the left side of the battery protection package. In this embodiment, the source pad 51 of the MOSFET 306 are electrically connected to VSS lead 320 and the source pad S2 of the MOSFET 308 are connected to OUTM lead 318. The VSS pad of power control IC 302 is electrically connected to the source pad 51 of the MOSFET 306.

Figure 3E:
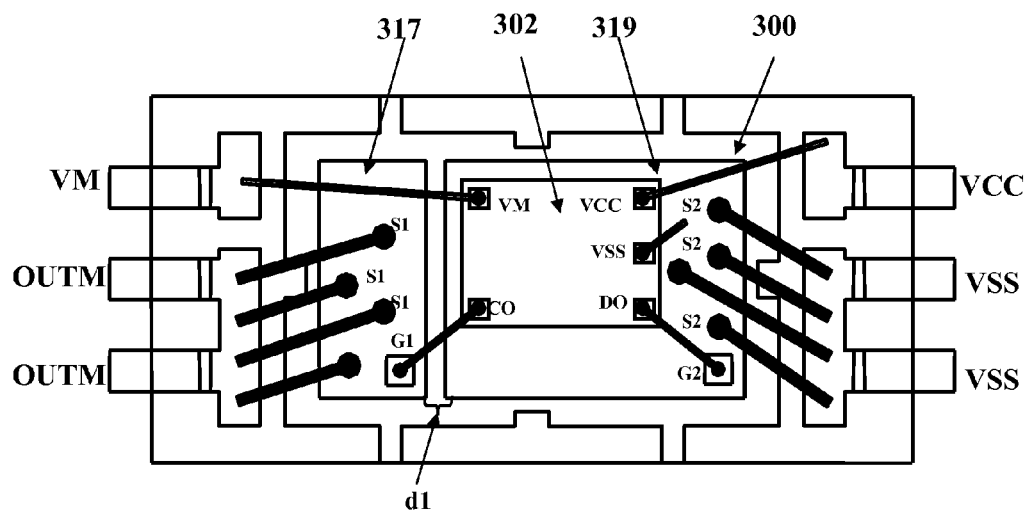
FIGS. 3E-3F are top views of battery protection package assemblies having two discrete common-drain MOSFETs of unequal size with VCC and VSS located on a right side of the battery protection package.
Figure 3F:
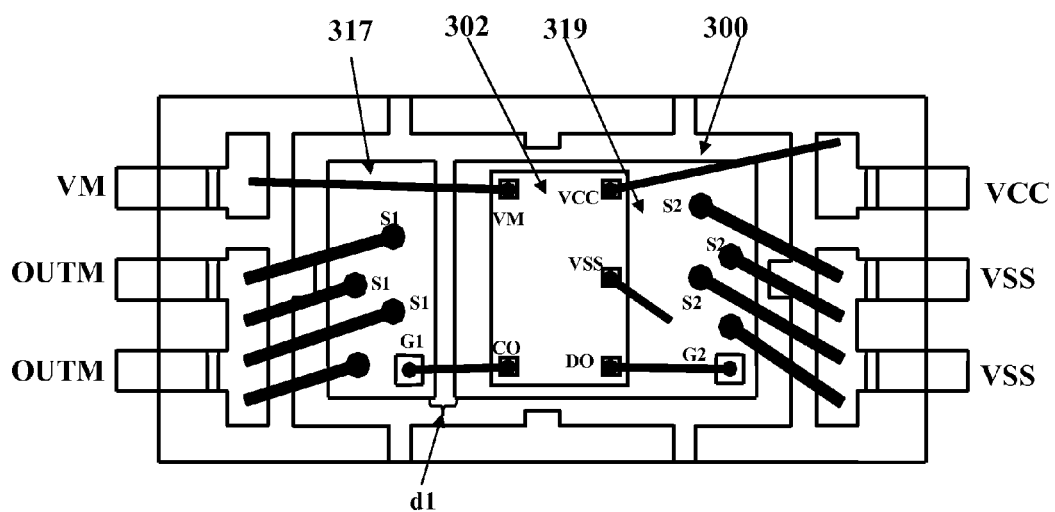

FIGS. 3E-3F are top views of alternative battery protection package assemblies with two discrete MOSFETs of unequal size placed side by side with a gap dl between them. Typically, a second MOSFET 319 is bigger than a first MOSFET 317. In FIGS. 3E-3F, the VCC and VSS leads are on the right side of the battery protection package. As shown in FIG. 3E, a power control IC 302 is stacked only on the MOSFET 319 in such a way that a long side of the power control IC 302 is parallel to a long side of the MOSFET 319. In FIG. 3F, the power control IC 302 is stacked only on the MOSFET 319 in such a way that a long side of the power control IC 302 is perpendicular to a long side of the MOSFET 319. VM and VCC pads of the power control IC 302 are electrically connected to the VM and VCC leads through bond wires 312 and 313 respectively. Output CO and DO pads of the power control IC 302 are electrically connected to gate pads G1 and G2 of MOSFETs 317 and 319 through bond wires 314 and 315 respectively. The VSS pad of power control IC 302 is electrically connected to the top source pad S2 of the MOSFET 319 through a bond wire 316. Source pads 51 of the MOSFET 317 and top source pads S2 of the MOSFET 319 may be electrically connected to the OUTM leads 318 and VSS lead 320 through multiple bond wires 310 and 322 respectively.

Figure 3G:
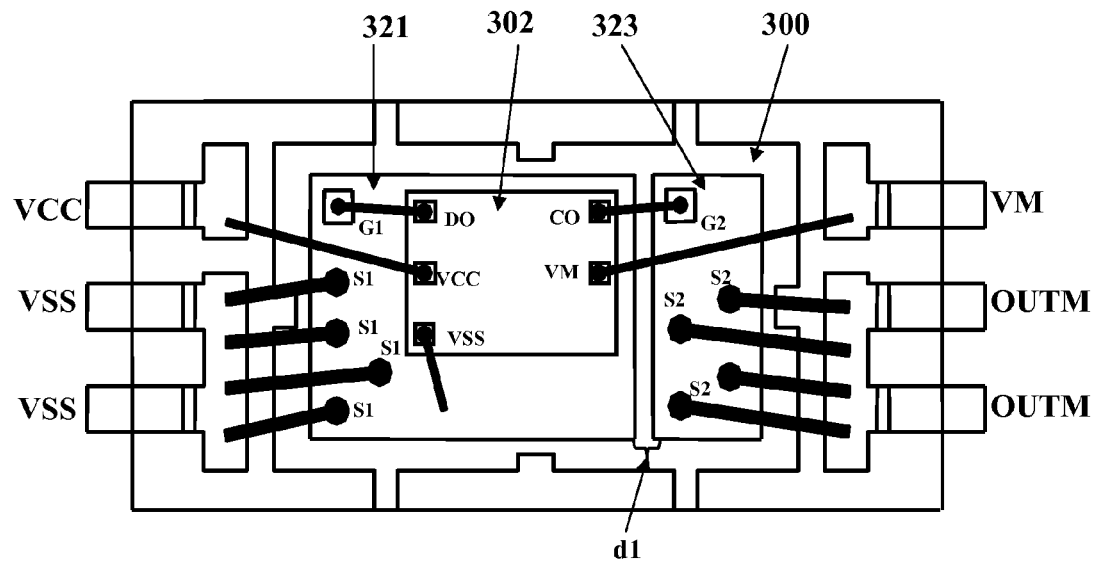
FIGS. 3G-3H are top views of battery protection package assemblies having two discrete common-drain MOSFETs of unequal size with VCC and VSS located on a left side of the battery protection package.
Figure 3H:
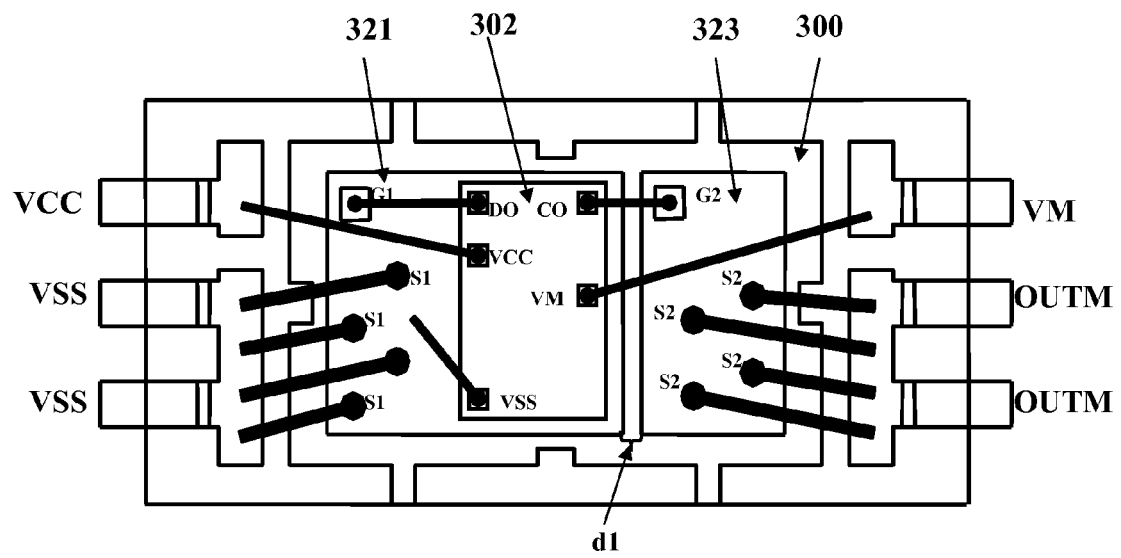

FIGS. 3G-3H are top views of other battery protection package assemblies with two discrete MOSFETs of unequal size placed side by side with a gap dl in between them. In this example, the VCC and VSS leads placed on the left side of the battery protection package. Typically, a first MOSFET 321 is bigger than a second MOSFET 323. In FIG. 3G, a power control IC 302 is stacked only on the first MOSFET 321 in such a way that a long side of the power control IC 302 is parallel to a long side of the first MOSFET 321. In FIG. 3H, the power control IC 302 is stacked only on the first MOSFET 321 in such a way that a long side of the power control IC 302 is perpendicular to a long side of the first MOSFET 321. VM and VCC pads of the power control IC 302 are electrically connected to the VM and VCC leads through bond wires 312 and 313 respectively. Output DO and CO pads of the power control IC 302 are electrically connected to gate pads G1 and G2 of the MOSFETs 321 and 323 through bond wires 314 and 315 respectively. The VSS pad of power control IC 302 is electrically connected to the top source pad 51 of the first MOSFET 321 through a bond wire 316. Source pads 51 of the first MOSFET 321 and top source pads S2 of the second MOSFET 323 are electrically connected to the VSS leads 320 and OUTM leads 318 through bond wires 322 and 310 respectively.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A battery protection package assembly, comprising:
a power control integrated circuit (IC), wherein pins for a supply voltage input (VCC) and a ground (VSS) of the power control IC are on a first side of the power control IC;
first and second common-drain metal oxide semiconductor field effect transistors (MOSFETs) electrically coupled to the power control IC, wherein the power control IC and the first and second common-drain metal oxide semiconductor field effect transistors (MOSFET) are co-packaged on a common die pad, wherein the power control IC is vertically stacked on top of one or more of the first and second common-drain MOSFETs, wherein leads coupled to a supply voltage input (VCC) and a ground (VSS) of the power control IC are on a first side of the common die pad.

2. The battery protection package assembly of claim 1, wherein the power control IC overlaps both of the first and second common-drain MOSFETs.

3. The battery protection package assembly of claim 1, wherein the first and second MOSFETs are integrated into a single chip.

4. The battery protection package of claim 3, wherein the first MOSFET is larger than the second MOSFET.

5. The battery protection package assembly of claim 4, wherein the power control IC is mounted over the first MOSFET.

* * * * *